(12) United States Patent
Lin et al.

(10) Patent No.: US 10,658,496 B2
(45) Date of Patent: May 19, 2020

(54) HIGH-SPEED SUPERJUNCTION LATERAL INSULATED GATE BIPOLAR TRANSISTOR

(71) Applicant: Chongqing University, Chongqing (CN)

(72) Inventors: Zhi Lin, Chongqing (CN); Qi Yuan, Chongqing (CN); Shu Han, Chongqing (CN); Shengdong Hu, Chongqing (CN); Jianlin Zhou, Chongqing (CN); Fang Tang, Chongqing (CN); Xichuan Zhou, Chongqing (CN)

(73) Assignee: Chongqing University, Chongqing (CN)

( * ) Notice: Subject to any disclaimer, the term of this patent is extended or adjusted under 35 U.S.C. 154(b) by 0 days.

(21) Appl. No.: 16/264,654

(22) Filed: Jan. 31, 2019

(65) Prior Publication Data

US 2019/0252531 A1 Aug. 15, 2019

(30) Foreign Application Priority Data

Feb. 10, 2018 (CN) .......................... 2018 1 0137194

(51) Int. Cl.
*H01L 29/739* (2006.01)
*H01L 29/06* (2006.01)
(Continued)

(52) U.S. Cl.
CPC ...... *H01L 29/7393* (2013.01); *H01L 29/0619* (2013.01); *H01L 29/0634* (2013.01); *H01L 29/0808* (2013.01); *H01L 29/0821* (2013.01); *H01L 29/0834* (2013.01); *H01L 29/1095* (2013.01); *H01L 29/36* (2013.01); *H01L 29/66325* (2013.01); *H01L 29/7394* (2013.01)

(58) Field of Classification Search
CPC ........... H01L 29/7393; H01L 29/66325; H01L 29/7394; H01L 29/1095; H01L 29/0834; H01L 29/0619; H01L 29/0821; H01L 29/0808; H01L 29/36; H01L 29/0634; H01L 29/10
See application file for complete search history.

(56) References Cited

U.S. PATENT DOCUMENTS

| 2007/0158678 A1* | 7/2007 | Udrea | H01L 29/0834 257/119 |
| 2011/0057230 A1* | 3/2011 | Udrea | H01L 29/66325 257/141 |
| 2014/0035036 A1* | 2/2014 | Onogi | H01L 29/7816 257/343 |

* cited by examiner

*Primary Examiner* — Yasser A Abdelaziez
(74) *Attorney, Agent, or Firm* — Wayne & Ken, LLC; Tony Hom

(57) ABSTRACT

The present disclosure relates to a high-speed superjunction lateral insulated gate bipolar transistor, and belongs to the technical field of semiconductor power devices. Fast turn-off can be achieved by replacing the lightly doped substrate of the existing bulk silicon superjunction lateral insulated gate bipolar transistor with heavily doped substrate, breakdown voltage of the device is ensured by reasonably setting the total number of impurities in each drift region of the over junction-sustaining voltage layer, and further application thereof in integrated circuits is realized by providing the semiconductor second substrate region and the semiconductor isolation region. A high speed superjunction laterally insulated gate bipolar transistor according to the present disclosure solves the contradiction between cost of the superjunction laterally insulated gate bipolar transistor and achievement of fast turn-off on a bulk silicon substrate.

10 Claims, 12 Drawing Sheets

(51) Int. Cl.
*H01L 29/36* (2006.01)
*H01L 29/08* (2006.01)
*H01L 29/10* (2006.01)
*H01L 29/66* (2006.01)

HIGH-SPEED SUPERJUNCTION LATERAL INSULATED GATE BIPOLAR TRANSISTOR

CROSS-REFERENCE TO RELATED APPLICATIONS

This application claims the benefit of priority from Chinese Patent Application No. CN201810137194.8, filed on Feb. 10, 2018. The content of the aforementioned application, including any intervening amendments thereto, is incorporated herein by reference in its entirety.

TECHNICAL FIELD

The present disclosure belongs to the technical field of semiconductor power devices, and in particular relates to a high-speed superjunction lateral insulated gate bipolar transistor.

BACKGROUND

In a superjunction lateral insulated gate bipolar transistor (LIGBT), electrons and holes participate in conduction at the same time. These two carriers form conductance modulation, which greatly reduces the specific on-resistance of the device. The chip region occupied by the device is reduced, and the typical structure can be referred to the transistor structure shown in FIG. 1. However, in devices fabricated with bulk silicon-based substrates, carriers can enter the lightly doped substrate to form unbalanced carriers. In this way, it takes a certain time to extract these carriers when the device is turned off, which increases the turn-off time and increases the power consumption.

At present, the most common solution is to use silicon-on-insulator (SOI) substrate instead of a bulk silicon substrate. As shown in FIG. 2, an insulator, which is typically a silica material, is inserted between the superjunction structure portion and the lightly doped substrate. The insulator layer can effectively block carriers from entering the lightly doped substrate, thereby avoiding the extraction of carriers in the lightly doped substrate during turn-off, shortening the turn-off time and reducing the turn-off power consumption. However, this solution has the disadvantages that the SOI substrate process is complicated and the cost is several times that of the bulk silicon material.

Another solution is to use an insulating substrate instead of a bulk silicon substrate, such as a sapphire substrate. As shown in FIG. 3, a semiconductor superjunction structure is fabricated on an intrinsic sapphire substrate. The intrinsic sapphire substrate is non-conductive and is a good insulator, so that the carriers in the semiconductor superjunction structure do not enter the intrinsic sapphire substrate, thus avoiding the extraction of carriers in the substrate during turn-off. Accordingly, the superjunction LIGBT fabricated on an insulating substrate such as sapphire has a short turn-off time and a low off-power consumption. However, the cost of the sapphire substrate in this solution is higher.

In summary, in the prior art, an insulator layer is inserted between the superjunction structure portion and the lightly doped substrate or the insulator substrate is directly used instead of the bulk silicon substrate to solve the problem that carriers in the LIGBT device will enter the lightly doped substrate. However, these solutions will lead to the problem of long turn-off time and high power consumption of the device, and cannot effectively cope with complicated process and high cost of the insulating substrate.

SUMMARY

In view of the defects of the prior art, the object of the present disclosure is to provide a high-speed superjunction lateral insulated gate bipolar transistor, which achieves the purpose of achieving fast turn-off of a superjunction LIGBT on a bulk silicon substrate at low cost.

In order to achieve the above object, the technical solution of the present disclosure:

A high-speed superjunction lateral insulated gate bipolar transistor, characterized in that a cell structure of the transistor comprises:

a semiconductor first substrate region;

a voltage-sustaining region, which is located on a surface of the semiconductor first substrate region, and comprises mutually alternating semiconductor first drift regions and semiconductor second drift regions of different conductivity types, the semiconductor first drift region has a conductivity type the same as that of the semiconductor first substrate region, and the semiconductor second drift region has a conductivity type opposite to that of the semiconductor first substrate region, the conductivity type being N type or P type;

a semiconductor field stop region having a conductivity type the same as that of the semiconductor first substrate region and located on a surface of the semiconductor first substrate region, wherein at least one semiconductor collector region having a conductivity type opposite to that of the semiconductor first substrate region is provided in the semiconductor field stop region, and a portion of a surface of the semiconductor collector region is covered with a conductor to form a collector of the transistor;

a semiconductor body region having a conductivity type opposite to that of the semiconductor first substrate region;

a semiconductor emitter region having a conductivity type the same as that of the semiconductor first substrate region and located in the semiconductor body region, a portion of the semiconductor body region and a portion of the semiconductor emitter region being connected by a conductor to form an emitter of the transistor;

a gate insulating layer covering a portion of a surface of the semiconductor emitter region, a portion of a surface of the semiconductor body region, and a portion of a surface of the voltage-sustaining region, wherein a semiconductor polysilicon gate region covering a surface of the gate insulating layer and a conductor covering the semiconductor polysilicon gate region form a gate electrode of the transistor, the gate region has a conductivity type the same as that of the semiconductor first substrate region; and a portion of the semiconductor emitter region, a portion of the semiconductor body region, the gate insulating layer, the semiconductor polysilicon gate region, the gate electrode and a portion of the voltage-sustaining region form a gate structure of the transistor;

wherein the semiconductor first drift region and the semiconductor second drift region are in contact with each other and contact surfaces are perpendicular to the semiconductor first substrate region and the semiconductor field stop region;

the voltage-sustaining region and the semiconductor field stop region are in contact with each other and a contact surface is perpendicular to the semiconductor first substrate region.

Further, the conductivity type is N type or P type.

Further, the semiconductor material used in the transistor includes, but is not limited to, any one of silicon, gallium arsenide, gallium nitride, or silicon carbide.

Further, the semiconductor field stop region is in contact with the semiconductor collector region through a semiconductor buffer region having a conductivity type the same as that of the semiconductor first substrate region, wherein the semiconductor buffer region is located in the semiconductor field stop region, and the semiconductor collector region is located in the semiconductor buffer region.

Further, the semiconductor field stop region is in contact with the semiconductor collector region through a semiconductor auxiliary region having a conductivity type opposite to that of the semiconductor first substrate region, wherein a contact surface is perpendicular to the semiconductor first substrate region, the semiconductor collector region is located in the semiconductor auxiliary region, and the semiconductor auxiliary region adopts an impurity concentration distribution the same as that of the semiconductor second drift region.

Further, the cell structure further comprises a second substrate region located on a bottom surface of the semiconductor first substrate region and having a doping concentration lower than that of the semiconductor first substrate region.

Further, the semiconductor field stop region is provided with at least one semiconductor first isolation region having a conductivity type the same as that of the semiconductor first substrate region, the semiconductor first isolation region and the semiconductor first substrate region are in contact with each other; a contact surface of the semiconductor field stop region and the semiconductor first isolation region is perpendicular to the semiconductor first substrate region. Further, the semiconductor field stop region is provided with at least one semiconductor second isolation region having a conductivity type the same as that of the semiconductor first substrate region, the semiconductor second isolation region and the semiconductor first substrate region are in contact with each other; a contact surface of the semiconductor field stop region and the semiconductor second isolation region is perpendicular to the semiconductor first substrate region.

Further, the gate structure is a planar gate structure or a trench type gate structure.

Further, the semiconductor first substrate region is a heavily doped region.

Compared with the prior art, the beneficial effects of the present disclosure are as follows:

The present disclosure effectively realizes the purpose of constructing a superjunction LIGBT on a bulk silicon substrate at a low cost to achieve fast turn-off. Specifically, this is achieved by making the semiconductor first substrate region a heavily doped region, thereby making the minority carriers injected from the semiconductor collector region are quickly compounded by the Auger effect, avoiding the accumulation of a large number of unbalanced carriers in the substrate and achieving the purpose of fast turn-off. In addition, since the total number of impurities in the semiconductor first drift region in the voltage-sustaining region is smaller than the total number of impurities in the semiconductor second drift region, the equivalent impurity in the voltage-sustaining layer is the second conductivity type. Specifically, along the direction in which the N-column and the P-column are arranged, by dividing the total number of impurities of the semiconductor second drift region minus the total number of impurities of the semiconductor first drift region by the length of the voltage-sustaining layer, the dose of the average impurity obtained is about $10^{12}$ cm$^{-2}$; when the device is in the forward blocking state, an electric field is established between these equivalent impurities and the impurities in the semiconductor first substrate region and the impurities in the semiconductor field stop region to obtain a high breakdown voltage.

BRIEF DESCRIPTION OF THE DRAWINGS

FIG. 1b is a schematic cross-sectional view corresponding to the broken line in FIG. 1a;

FIG. 2b is a schematic cross-sectional view corresponding to the broken line in FIG. 2a;

FIG. 3b is a schematic cross-sectional view corresponding to the broken line in FIG. 3a;

FIG. 4b is a schematic cross-sectional view corresponding to the broken line in FIG. 4a;

FIG. 5b is a schematic cross-sectional view corresponding to the broken line in FIG. 5a;

FIG. 6b is a schematic cross-sectional view corresponding to the broken line in FIG. 6a;

FIG. 7b is a schematic cross-sectional view corresponding to the broken line in FIG. 7a;

FIG. 8b is a schematic cross-sectional view corresponding to the broken line in FIG. 8a;

FIG. 9b is a schematic cross-sectional view corresponding to the broken line in FIG. 9a;

FIG. 10b is a schematic cross-sectional view corresponding to the broken line in FIG. 10a;

FIG. 11b is a schematic cross-sectional view corresponding to the broken line in FIG. 11a;

FIG. 12b is a schematic cross-sectional view corresponding to the broken line in FIG. 12a.

Figure 1A:
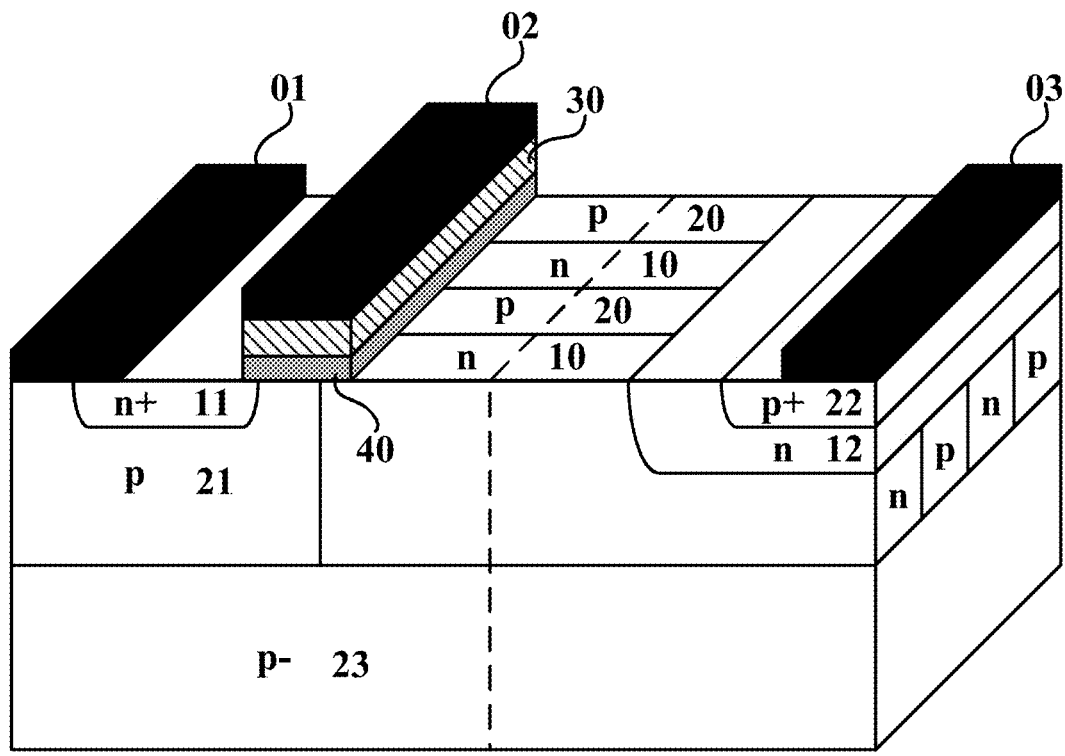
FIG. 1a is a schematic structural view of a conventional superjunction LIGBT.
Figure 1B:
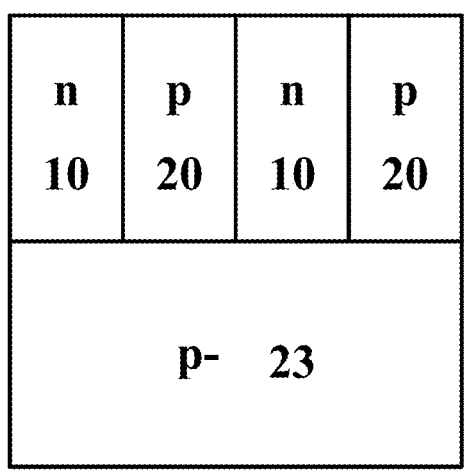
Figure 2A:
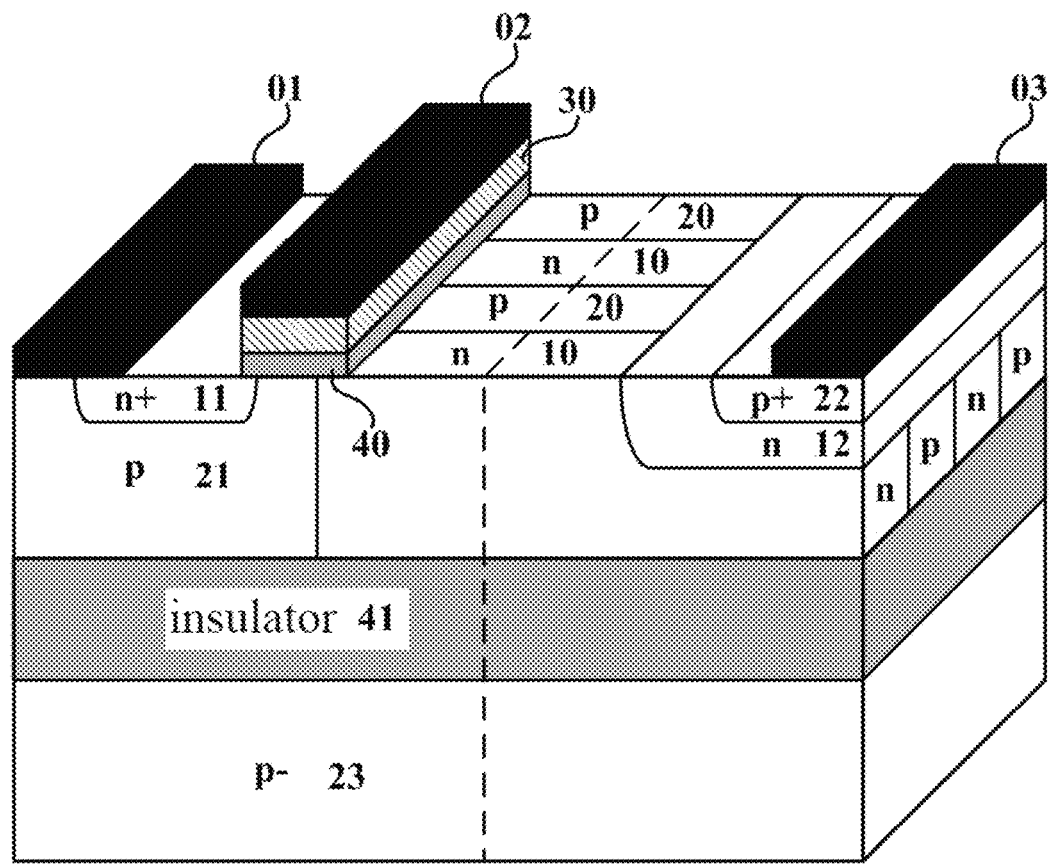
FIG. 2a is a schematic structural view of an SOI substrate superjunction LIGBT.
Figure 2B:
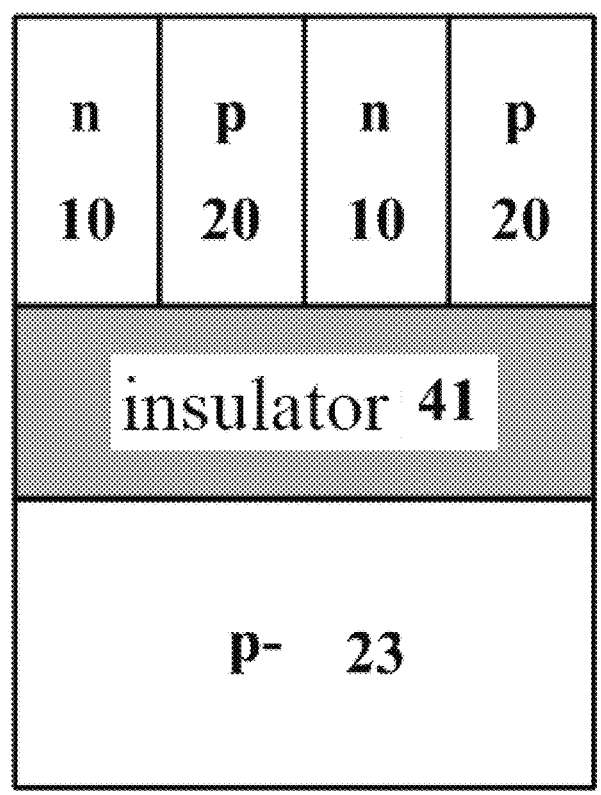
Figure 3A:
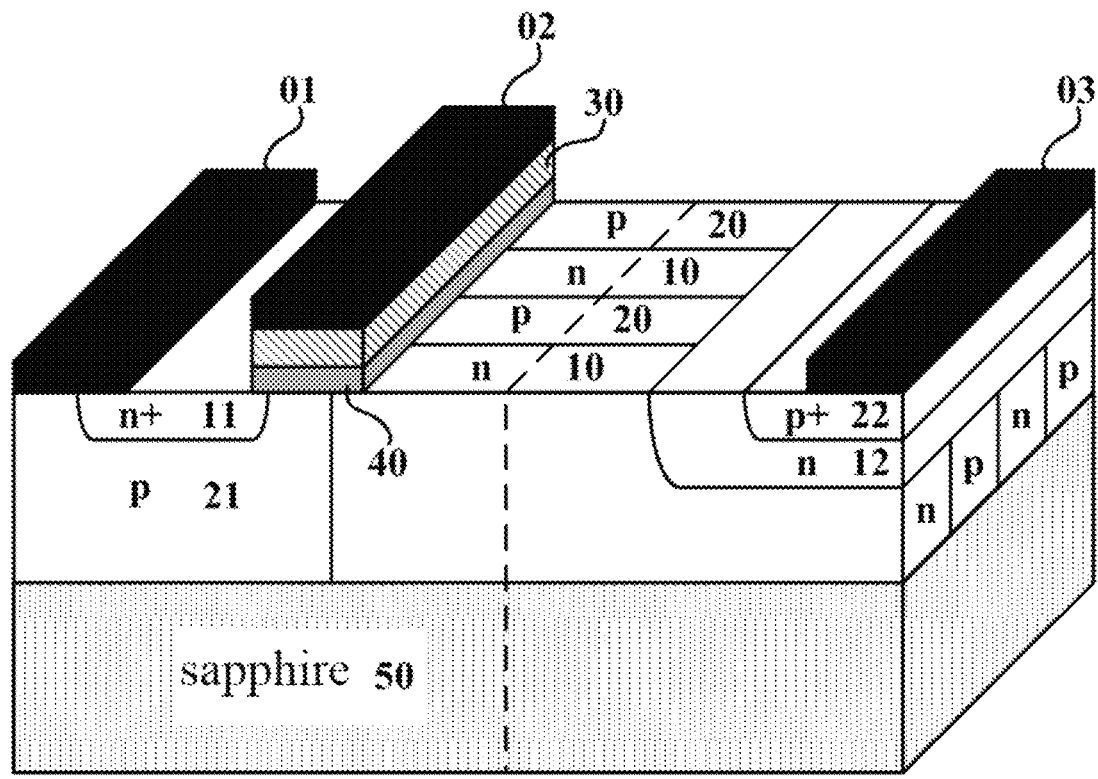
FIG. 3a is a schematic structural view of a sapphire substrate superjunction LIGBT.
Figure 3B:
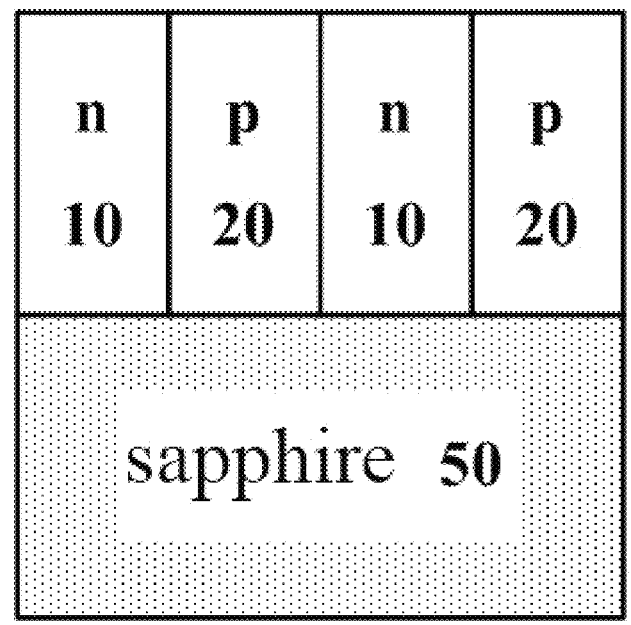

In the drawings: 01, emitter, 02, gate electrode, 03, collector, 10, semiconductor first drift region, 11, semiconductor emitter region, 12, semiconductor buffer region, 13, semiconductor field stop region, 14, semiconductor first substrate region, 15, semiconductor first isolation region, 16, semiconductor second isolation region, 20, semiconductor second drift region, 21, semiconductor body region, 22, semiconductor collector region, 23, semiconductor second substrate region, 24, semiconductor auxiliary region, 30, polysilicon gate region, 40, gate insulation layer, 41, insulator, 50, sapphire.

DETAILED DESCRIPTION OF EMBODIMENTS

In order to make the objects, technical solutions and advantages of the present disclosure clearer, the present disclosure will be clearly and completely described in conjunction with the drawings in the embodiments of the present disclosure. It is apparent that the described embodiments are part of the embodiments of the present disclosure, and not all of the embodiments. All other embodiments obtained by a person of ordinary skill in the art based on the embodiments of the present disclosure without creative efforts are within the scope of the present disclosure.

It is to be understood that the terms "first", "second", and the like in the specification and claims of the present disclosure are used to distinguish similar objects, and are not necessarily used to describe a particular order or sequence. It will be understood that the data so used may be interchanged where appropriate to facilitate the embodiments of the present disclosure described herein. In addition, the terms "comprise" and "include" and variations thereof are intended to cover a non-exclusive inclusion, for example, a process, method, system, product, or device that comprises a series of steps or units is not necessarily limited to those steps or units explicitly listed and may include other steps or units not explicitly listed or inherent to such processes, methods, products or devices.

Embodiments of the present disclosure provide a cell structure corresponding to a superjunction LIGBT. The cell structure of the superjunction LIGBT includes: a semiconductor first substrate region, the semiconductor first substrate region is a heavily doped region having a doping concentration greater than $10^{18}$ cm$^{-3}$; and a voltage-sustaining region, which is located on a surface of the semiconductor first substrate region, and comprises mutually alternating semiconductor first drift regions and semiconductor second drift regions of different conductivity types, the semiconductor first drift region has a conductivity type the same as that of the semiconductor first substrate region, and the semiconductor second drift region has a conductivity type opposite to that of the semiconductor first substrate region, the conductivity type being N type or P type;

a semiconductor field stop region having a conductivity type the same as that of the semiconductor first substrate region and located on a surface of the semiconductor first substrate region, wherein at least one semiconductor collector region having a conductivity type opposite to that of the semiconductor first substrate region is provided in the semiconductor field stop region, and a portion of a surface of the semiconductor collector region is covered with a conductor to form a collector of the transistor; a semiconductor body region having a conductivity type opposite to that of the semiconductor first substrate region; a semiconductor emitter region having a conductivity type the same as that of the semiconductor first substrate region and located in the semiconductor body region, a portion of the semiconductor emitter region and a portion of the semiconductor emitter region being connected by a conductor to form an emitter of the transistor; a gate insulating layer covering a portion of a surface of the semiconductor emitter region, a portion of a surface of the semiconductor body region, and a portion of a surface of the voltage-sustaining region, wherein a semiconductor polysilicon gate region covering a surface of the gate insulating layer and a conductor covering the semiconductor polysilicon gate region form a gate electrode of the transistor, the gate region has a conductivity type the same as that of the semiconductor first substrate region; and a portion of the semiconductor emitter region, a portion of the semiconductor body region, the gate insulating layer, the semiconductor polysilicon gate region, the gate electrode and a portion of the voltage-sustaining region form a gate structure of the transistor; wherein the semiconductor first drift region and the semiconductor second drift region are in contact with each other and contact surfaces are perpendicular to the semiconductor first substrate region and the semiconductor field stop region; the voltage-sustaining region and the semiconductor field stop region are in contact with each other and a contact surface is perpendicular to the semiconductor first substrate region.

In an alternative embodiment, the cell structure further includes a second substrate region located on a bottom surface of the semiconductor first substrate region and having a doping concentration lower than the semiconductor first substrate region, preferably the doping concentration is lower than $10^{17}$ cm$^{-3}$; so as to realize its application in integrated circuits.

In an alternative embodiment, the semiconductor material used in the transistor includes, but is not limited to, any one of silicon, gallium arsenide, gallium nitride, or silicon carbide.

In an alternative embodiment, the semiconductor field stop region is in contact with the semiconductor collector region through a buffer region having a conductivity type the same as that of the semiconductor first substrate region, wherein the buffer region is located in the semiconductor field stop region, and the semiconductor collector region is located in the semiconductor buffer region.

In an alternative embodiment, the semiconductor field stop region is in contact with the semiconductor collector region through a semiconductor auxiliary region having a conductivity type opposite to that of the semiconductor first substrate region, wherein a contact surface is perpendicular to the semiconductor first substrate region, the semiconductor collector region is located in the semiconductor auxiliary region, and the semiconductor auxiliary region adopts an impurity concentration distribution the same as that of the semiconductor second drift region. In an alternative embodiment, the semiconductor field stop region is provided with at least one semiconductor first isolation region having a conductivity type the same as that of the semiconductor first substrate region to achieve a better isolation effect, the semiconductor first isolation region and the semiconductor first substrate region are in contact with each other; a contact surface of the semiconductor field stop region and the semiconductor first isolation region is perpendicular to the semiconductor first substrate region. Preferably, the first isolation region of the semiconductor has a doping concentration greater than $10^{18}$ cm$^{-3}$.

In an alternative embodiment, the semiconductor field stop region is provided with at least one semiconductor second isolation region having a conductivity type the same as that of the semiconductor first substrate region, the semiconductor second isolation region and the semiconductor first substrate region are in contact with each other; a contact surface of the semiconductor field stop region and the semiconductor second isolation region is perpendicular to the semiconductor first substrate region. Preferably, the semiconductor auxiliary region and the semiconductor second isolation region have a doping concentration greater than $10^{18}$ cm$^{-3}$.

In the above alternative embodiments, the present disclosure has two important principles: on the one hand, the semiconductor first substrate region is a heavily doped region, thereby making the minority carriers injected from the semiconductor collector region are quickly compounded by the Auger effect, avoiding the accumulation of a large number of unbalanced carriers in the substrate and achieving the purpose of fast turn-off. On the other hand, since the total number of impurities in the semiconductor first drift region in the voltage-sustaining region is smaller than the total number of impurities in the semiconductor second drift region, the equivalent impurity in the voltage-sustaining layer is the second conductivity type. Specifically, along the direction in which the N-column and the P-column are arranged, by dividing the total number of impurities of the semiconductor second drift region minus the total number of impurities of the semiconductor first drift region by the length of the voltage-sustaining layer, the dose of the average impurity obtained is about $10^{12}$ cm$^{-2}$; when the device is in the forward blocking state, an electric field is established between these equivalent impurities and the impurities in the semiconductor first substrate region and the impurities in the semiconductor field stop region to obtain a high breakdown voltage.

Figure 4A:
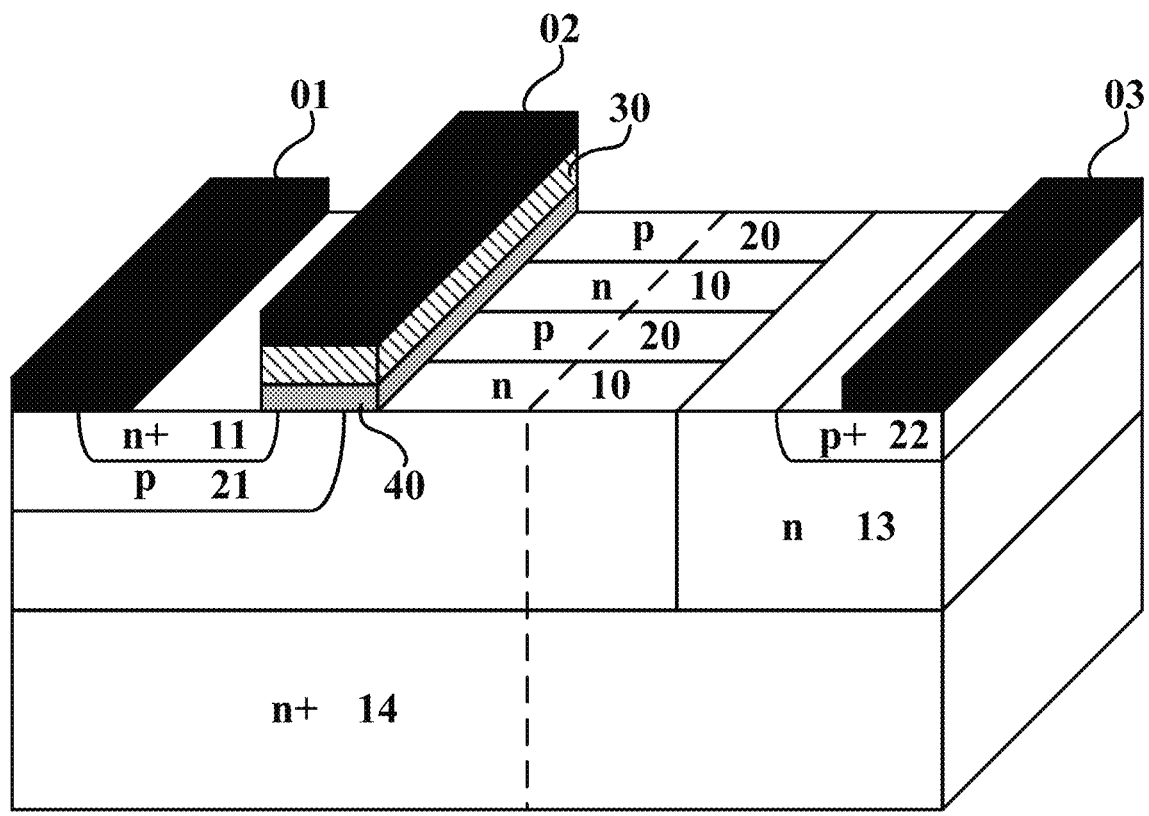
FIG. 4a is a schematic structural view of a superjunction LIGBT corresponding to Example 1 of the present disclosure.
Figure 4B:
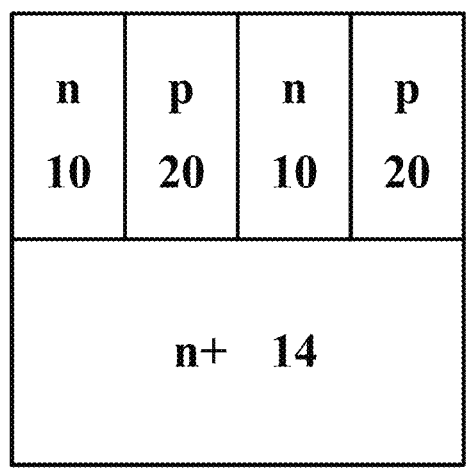

The following content is explained by several alternative embodiments:

In Example 1 shown in FIG. 4a to FIG. 4b, the superjunction LIGBT has a cell structure including: a semiconductor first substrate region 14, which is a heavily doped region and has a doping concentration that is greater than $10^{18}$ cm$^{-3}$; a voltage-sustaining region, which is located on a surface of the semiconductor first substrate region, and comprises mutually alternating semiconductor first drift regions 10 and semiconductor second drift regions 20 of different conductivity types, the semiconductor first drift region 10 has a conductivity type the same as that of the semiconductor first substrate region 14, which conductivity type being N type, and the semiconductor second drift region 20 has a conductivity type of P type; a semiconductor field stop region 13 having a conductivity type the same as that of the semiconductor first substrate region 14, that is N type, and located on a surface of the semiconductor first substrate region 14, wherein at least one semiconductor collector region 22 having a conductivity type of P type is provided in the semiconductor field stop region 13, and a portion of a surface of the semiconductor collector region 22 is covered with a conductor to form a collector 3 of the transistor; a semiconductor body region 21 having a conductivity type of P type; a semiconductor emitter region 11 having a conductivity type of N type and is located in the semiconductor body region 21, a portion of the semiconductor body region 21 and a portion of the semiconductor emitter region 11 being connected by a conductor to form an emitter 1 of the transistor; a gate insulating layer 40 covering a portion of a surface of the semiconductor emitter region 11, a portion of a surface of the semiconductor body region 21, and a portion of a surface of the voltage-sustaining region, wherein a semiconductor polysilicon gate region 30 covering a surface of the gate insulating layer 40 and a conductor covering the semiconductor polysilicon gate region 30 form a gate electrode 2 of the transistor, the polysilicon gate region 30 has a conductivity type of N type; and a portion of the semiconductor emitter region 11, a portion of the semiconductor body region 21, the gate insulating layer 40, the semiconductor polysilicon gate region 30, the gate electrode 2 and a portion of the voltage-sustaining region form a gate structure of the transistor, and the gate structure is a planar gate structure or a trench gate structure; wherein the semiconductor first drift region 10 and the semiconductor second drift region 20 are in contact with each other and contact surfaces are perpendicular to the semiconductor first substrate region 14 and the semiconductor field stop region 13; the voltage-sustaining region and the semiconductor field stop region 13 are in contact with each other and a contact surface is perpendicular to the semiconductor first substrate region 14.

Figure 5A:
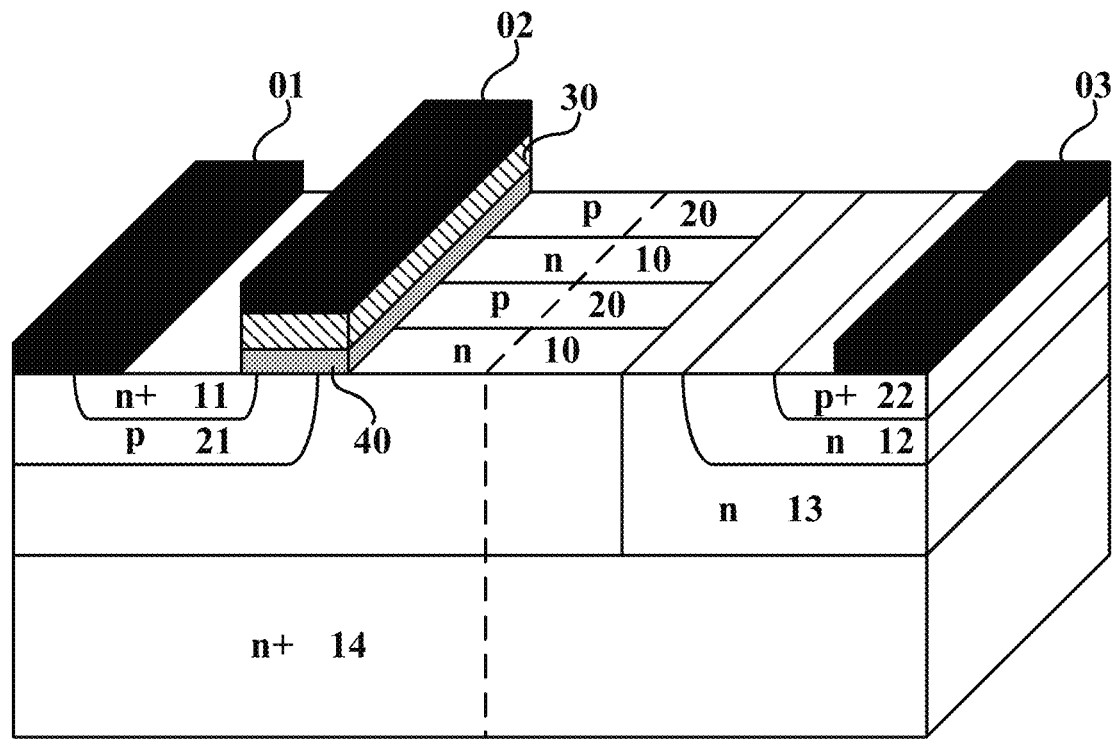
FIG. 5a is a schematic structural view of a superjunction LIGBT corresponding to Example 2 of the present disclosure.
Figure 5B:
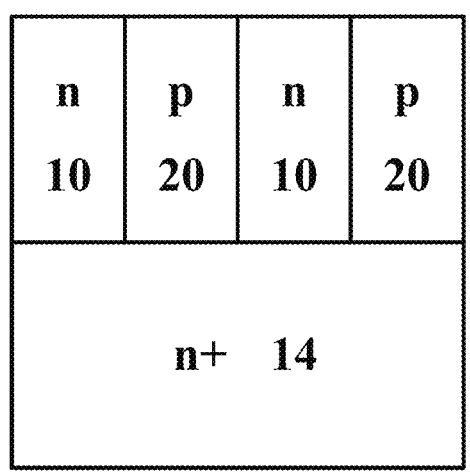

As shown in FIG. 5a to FIG. 5b, the superjunction LIGBT has a cell structure including: a semiconductor first substrate region 14, which is a heavily doped region and has a doping concentration that is greater than $10^{18}$ cm$^{-3}$; a voltage-sustaining region, which is located on a surface of the semiconductor first substrate region, and comprises mutually alternating semiconductor first drift regions 10 and semiconductor second drift regions 20 of different conductivity types, the semiconductor first drift region 10 has a conductivity type the same as that of the semiconductor first substrate region 14, which conductivity type being N type, and the semiconductor second drift region 20 has a conductivity type of P type; a semiconductor field stop region 13 having a conductivity type the same as that of the semiconductor first substrate region 14, that is N type, and located on a surface of the semiconductor first substrate region 14, wherein at least one semiconductor collector region 22 having a conductivity type of P type is provided in the semiconductor field stop region 13, and a portion of a surface of the semiconductor collector region 22 is covered with a conductor to form a collector 3 of the transistor; a semiconductor body region 21 having a conductivity type of P type; a semiconductor emitter region 11 having a conductivity type of N type and is located in the semiconductor body region 21, a portion of the semiconductor body region 21 and a portion of the semiconductor emitter region 11 being connected by a conductor to form an emitter 1 of the transistor; a gate insulating layer 40 covering a portion of a surface of the semiconductor emitter region 11, a portion of a surface of the semiconductor body region 21, and a portion of a surface of the voltage-sustaining region, wherein a semiconductor polysilicon gate region 30 covering a surface of the gate insulating layer 40 and a conductor covering the semiconductor polysilicon gate region 30 form a gate electrode 2 of the transistor, the polysilicon gate region 30 has a conductivity type of N type; and a portion of the semiconductor emitter region 11, a portion of the semiconductor body region 21, the gate insulating layer 40, the semiconductor polysilicon gate region 30, the gate electrode 2 and a portion of the voltage-sustaining region form a gate structure of the transistor, and the gate structure is a planar gate structure or a trench gate structure; wherein the semiconductor first drift region 10 and the semiconductor second drift region 20 are in contact with each other and contact surfaces are perpendicular to the semiconductor first substrate region 14 and the semiconductor field stop region 13; the voltage-sustaining region and the semiconductor field stop region 13 are in contact with each other and a contact surface is perpendicular to the semiconductor first substrate region 14; the semiconductor field stop region 13 is in contact with the semiconductor collector region 22 through a semiconductor buffer region 12 having a conductivity type of N type, wherein the semiconductor buffer region 12 is located in the semiconductor field stop region 13, and the semiconductor collector region 22 is located in the semiconductor buffer region 12.

Figure 6A:
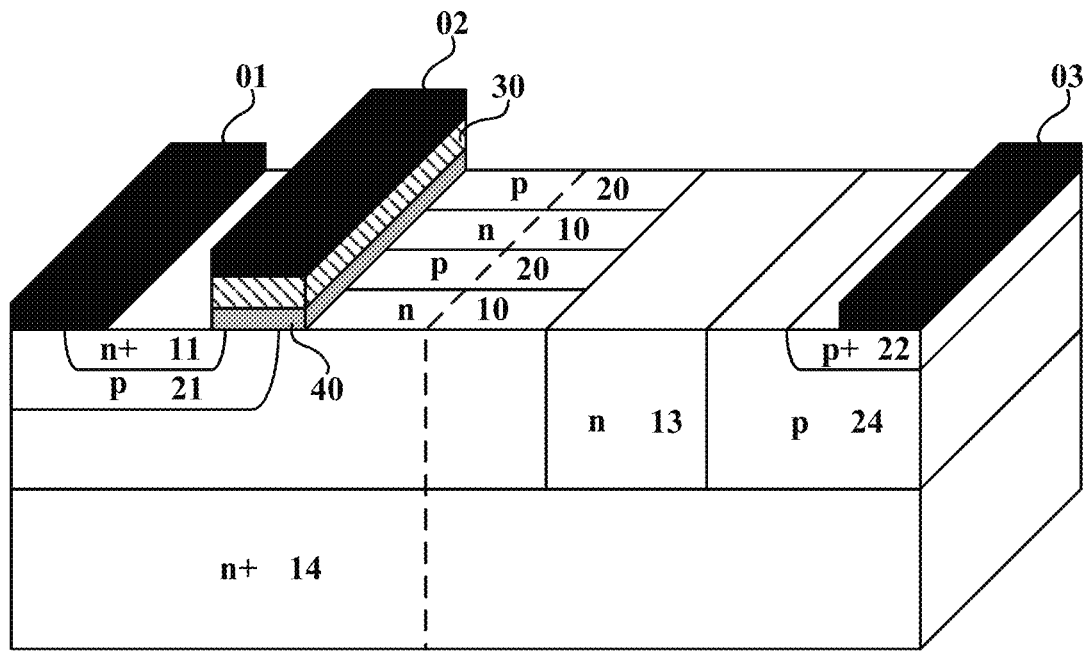
FIG. 6a is a schematic structural view of a superjunction LIGBT corresponding to Example 3 of the present disclosure.
Figure 6B:
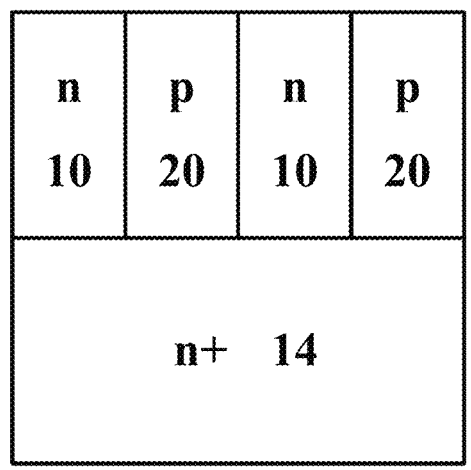

As shown in FIG. 6a to FIG. 6b, the superjunction LIGBT has a cell structure including: a semiconductor first substrate region 14, which is a heavily doped region and has a doping concentration that is greater than $10^{18}$ cm$^{-3}$; a voltage-sustaining region, which is located on a surface of the semiconductor first substrate region, and comprises mutually alternating semiconductor first drift regions 10 and semiconductor second drift regions 20 of different conductivity types, the semiconductor first drift region 10 has a conductivity type the same as that of the semiconductor first substrate region 14, which conductivity type being N type, and the semiconductor second drift region 20 has a conductivity type of P type; a semiconductor field stop region 13 having a conductivity type the same as that of the semiconductor first substrate region 14, that is N type, and located on a surface of the semiconductor first substrate region 14, wherein at least one semiconductor collector region 22 having a conductivity type of P type is provided in the semiconductor field stop region 13, and a portion of a surface of the semiconductor collector region 22 is covered with a conductor to form a collector 3 of the transistor; a semiconductor body region 21 having a conductivity type of P type; a semiconductor emitter region 11 having a conductivity type of N type and is located in the semiconductor body region 21, a portion of the semiconductor body region 21 and a portion of the semiconductor emitter region 11 being connected by a conductor to form an emitter 1 of the transistor; a gate insulating layer 40 covering a portion of a surface of the semiconductor emitter region 11, a portion of a surface of the semiconductor body region 21, and a portion of a surface of the voltage-sustaining region, wherein a semiconductor polysilicon gate region 30 covering a surface of the gate insulating layer 40 and a conductor covering the semiconductor polysilicon gate region 30 form a gate electrode 2 of the transistor, the polysilicon gate region 30 has a conductivity type of N type; and a portion of the semiconductor emitter region 11, a portion of the semiconductor body region 21, the gate insulating layer 40, the semiconductor polysilicon gate region 30, the gate electrode 2 and a portion of the voltage-sustaining region form a gate structure of the transistor, and the gate structure is a planar gate structure or a trench gate structure; wherein the semiconductor first drift region 10 and the semiconductor second drift region 20 are in contact with each other and contact surfaces are perpendicular to the semiconductor first substrate region 14 and the semiconductor field stop region 13; the voltage-sustaining region and the semiconductor field stop region 13 are in contact with each other and a contact surface is perpendicular to the semiconductor first substrate region 14; the semiconductor field stop region 13 is in contact with the semiconductor collector region 22 through a semiconductor auxiliary region 24 having a conductivity type of P type, wherein a contact surface is perpendicular to the semiconductor first substrate region 14, the semiconductor collector region 22 is located in the semiconductor auxiliary region 24, and the semiconductor auxiliary region 24 adopts an impurity concentration distribution the same as that of the semiconductor second drift region 20.

Figure 7A:
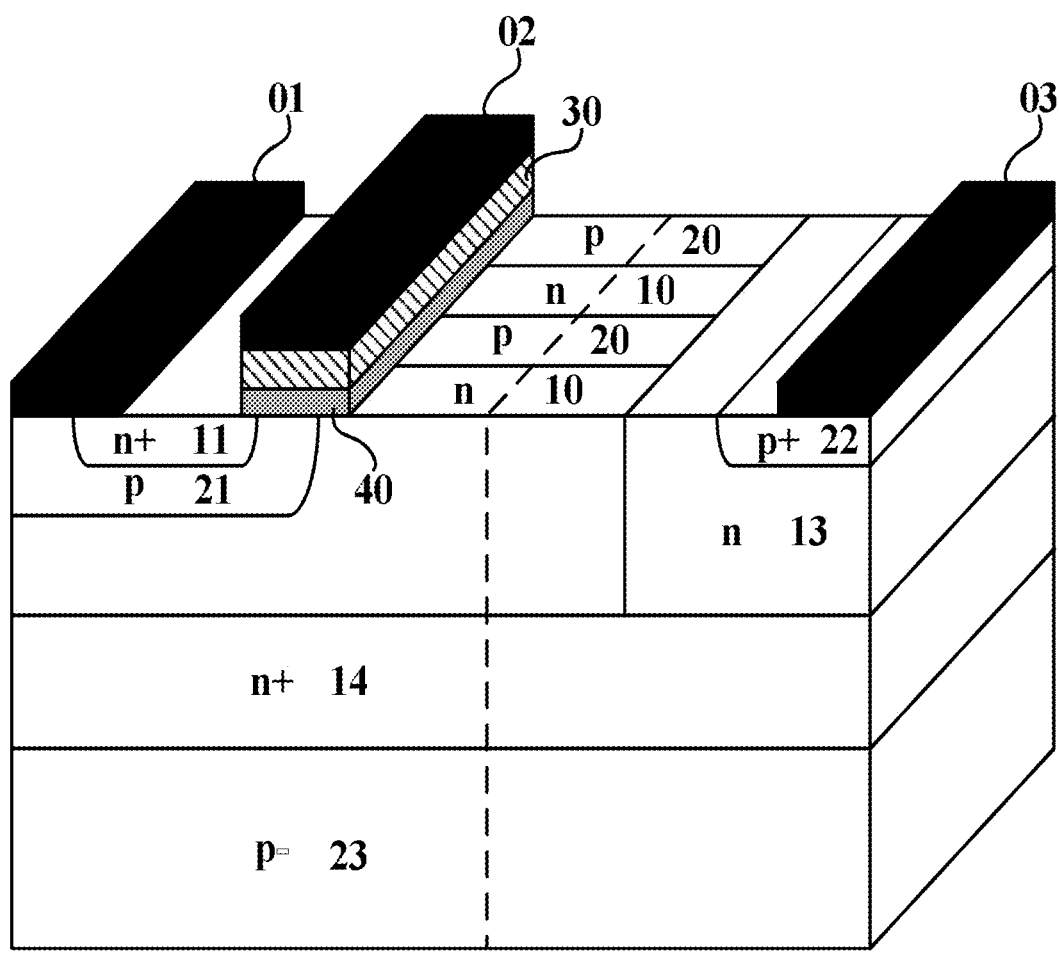
FIG. 7a is a schematic structural view of a superjunction LIGBT corresponding to Example 4 of the present disclosure.
Figure 7B:
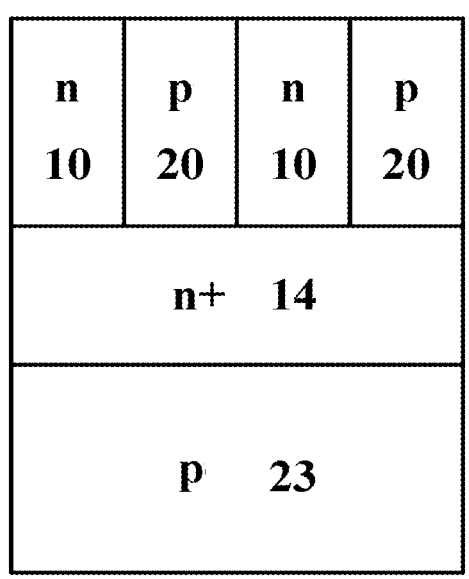

As shown in FIG. 7a-FIG. 7b, the superjunction LIGBT has a cell structure including: a semiconductor first substrate region 14, which is a heavily doped region and has a doping concentration that is greater than $10^{18}$ cm$^{-3}$; a voltage-sustaining region, which is located on a surface of the semiconductor first substrate region, and comprises mutually alternating semiconductor first drift regions 10 and semiconductor second drift regions 20 of different conductivity types, the semiconductor first drift region 10 has a conductivity type the same as that of the semiconductor first substrate region 14, which conductivity type being N-type, and the semiconductor second drift region 20 has a conductivity type of P-type; a semiconductor field stop region 13 having a conductivity type the same as that of the semiconductor first substrate region 14, that is N-type, and located on a surface of the semiconductor first substrate region 14, wherein at least one semiconductor collector region 22 having a conductivity type of P-type is provided in the semiconductor field stop region 13, and a portion of a surface of the semiconductor collector region 22 is covered with a conductor to form a collector 3 of the transistor; a semiconductor body region 21 having a conductivity type of P-type; a semiconductor emitter region 11 having a conductivity type of N-type and is located in the semiconductor body region 21, a portion of the semiconductor body region 21 and a portion of the semiconductor emitter region 11 being connected by a conductor to form an emitter 1 of the transistor; a gate insulating layer 40 covering a portion of a surface of the semiconductor emitter region 11, a portion of a surface of the semiconductor body region 21, and a portion of a surface of the voltage-sustaining region, wherein a semiconductor polysilicon gate region 30 covering a surface of the gate insulating layer 40 and a conductor covering the semiconductor polysilicon gate region 30 form a gate electrode 2 of the transistor, the polysilicon gate region 30 has a conductivity type of N-type; and a portion of the semiconductor emitter region 11, a portion of the semiconductor body region 21, the gate insulating layer 40, the semiconductor polysilicon gate region 30, the gate electrode 2 and a portion of the voltage-sustaining region form a gate structure of the transistor, and the gate structure is a planar gate structure or a trench gate structure; wherein the semiconductor first drift region 10 and the semiconductor second drift region 20 are in contact with each other and contact surfaces are perpendicular to the semiconductor first substrate region 14 and the semiconductor field stop region 13; the voltage-sustaining region and the semiconductor field stop region 13 are in contact with each other and a contact surface is perpendicular to the semiconductor first substrate region 14; the cell structure further includes a second substrate region 23 located at a bottom surface of the semiconductor first substrate region 14 and having a doping concentration lower than that of the semiconductor first substrate region 14.

Figure 8A:
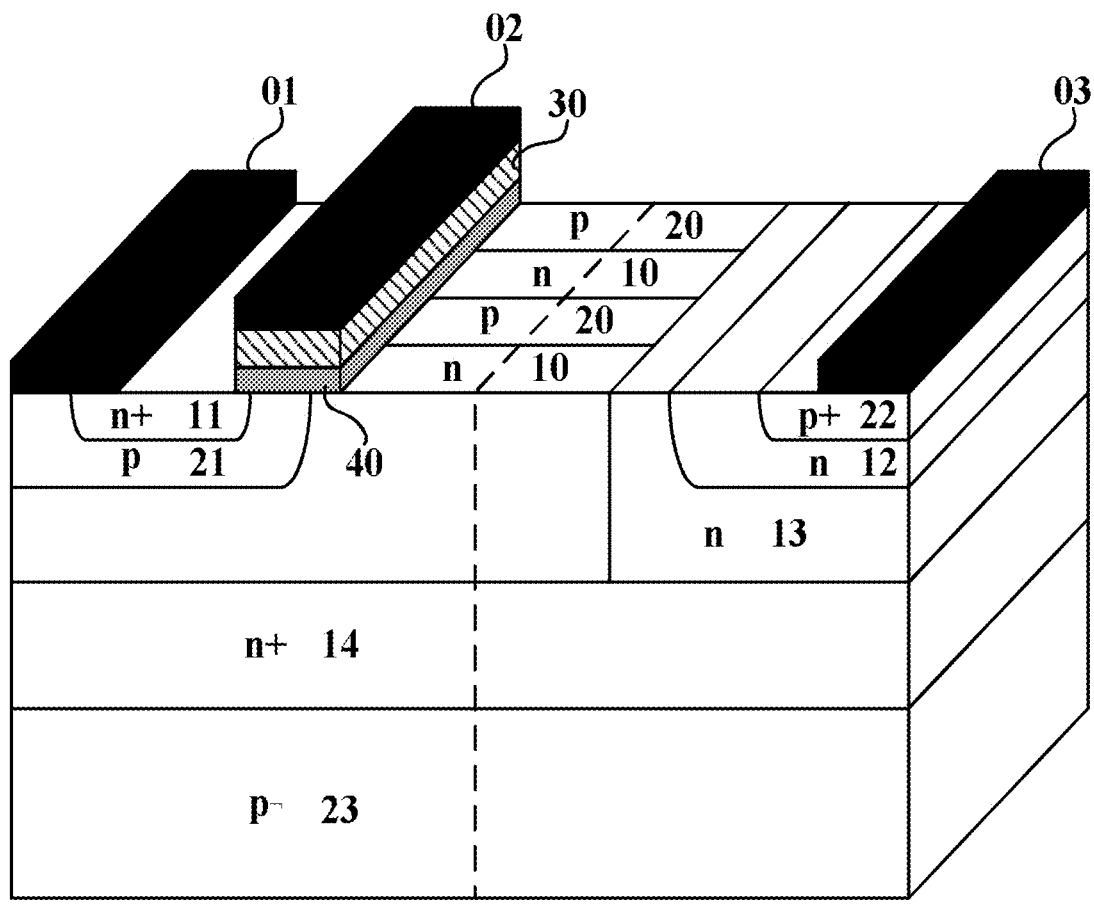
FIG. 8a is a schematic structural view of a superjunction LIGBT corresponding to Example 5 of the present disclosure.
Figure 8B:
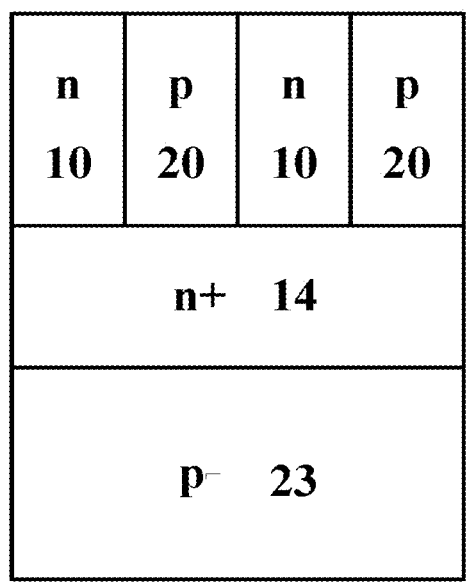

As shown in FIG. 8a to FIG. 8b, the superjunction LIGBT has a cell structure including: a semiconductor first substrate region 14, which is a heavily doped region and has a doping concentration that is greater than $10^{18}$ cm$^{-3}$; a voltage-sustaining region, which is located on a surface of the semiconductor first substrate region, and comprises mutually alternating semiconductor first drift regions 10 and semiconductor second drift regions 20 of different conductivity types, the semiconductor first drift region 10 has a conductivity type the same as that of the semiconductor first substrate region 14, which conductivity type being N-type, and the semiconductor second drift region 20 has a conductivity type of P-type; a semiconductor field stop region 13 having a conductivity type the same as that of the semiconductor first substrate region 14, that is N-type, and located on a surface of the semiconductor first substrate region 14, wherein at least one semiconductor collector region 22 having a conductivity type of P-type is provided in the semiconductor field stop region 13, and a portion of a surface of the semiconductor collector region 22 is covered with a conductor to form a collector 3 of the transistor; a semiconductor body region 21 having a conductivity type of P-type; a semiconductor emitter region 11 having a conductivity type of N-type and is located in the semiconductor body region 21, a portion of the semiconductor body region 21 and a portion of the semiconductor emitter region 11 being connected by a conductor to form an emitter 1 of the transistor; a gate insulating layer 40 covering a portion of a surface of the semiconductor emitter region 11, a portion of a surface of the semiconductor body region 21, and a portion of a surface of the voltage-sustaining region, wherein a semiconductor polysilicon gate region 30 covering a surface of the gate insulating layer 40 and a conductor covering the semiconductor polysilicon gate region 30 form a gate electrode 2 of the transistor, the polysilicon gate region 30 has a conductivity type of N-type; and a portion of the semiconductor emitter region 11, a portion of the semiconductor body region 21, the gate insulating layer 40, the semiconductor polysilicon gate region 30, the gate electrode 2 and a portion of the voltage-sustaining region form a gate structure of the transistor, and the gate structure is a planar gate structure or a trench gate structure; wherein the semiconductor first drift region 10 and the semiconductor second drift region 20 are in contact with each other and contact surfaces are perpendicular to the semiconductor first substrate region 14 and the semiconductor field stop region 13; the voltage-sustaining region and the semiconductor field stop region 13 are in contact with each other and a contact surface is perpendicular to the semiconductor first substrate region 14; the semiconductor field stop region 13 is in contact with the semiconductor collector region 22 by a semiconductor buffer region 12 having a conductivity type of N type, wherein the semiconductor buffer region 12 is located in the semiconductor field stop region 13, and the semiconductor collector region 22 is located in the semiconductor buffer region 12; the cell structure further comprises a second substrate region 23 located on a bottom surface of the semiconductor first substrate region 14 and having a doping concentration lower than that of the semiconductor first substrate region 14.

Figure 9A:
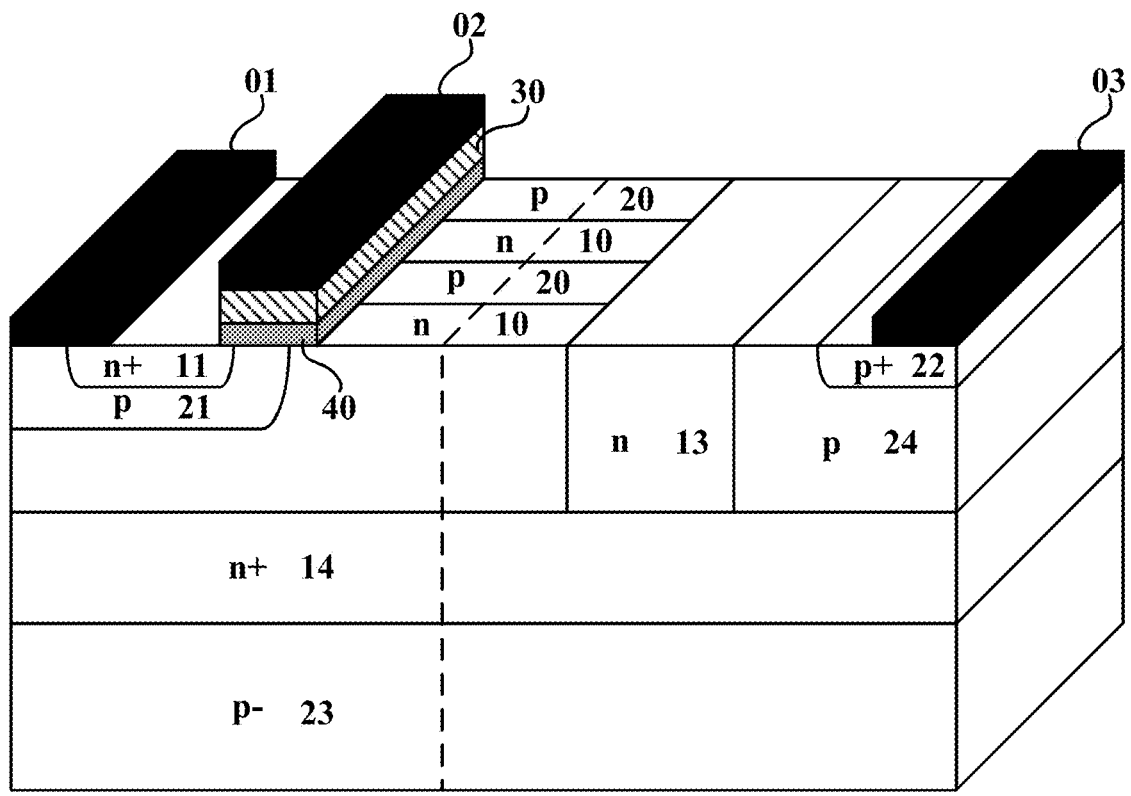
FIG. 9a is a schematic structural view of a superjunction LIGBT corresponding to Example 6 of the present disclosure.
Figure 9B:
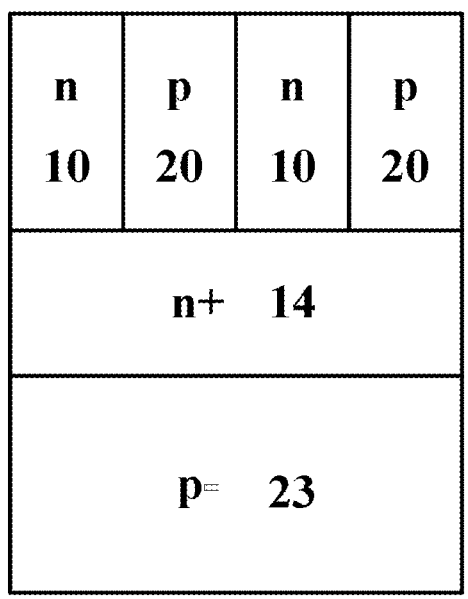

As shown in FIG. 9a-FIG. 9b, the superjunction LIGBT has a cell structure including: a semiconductor first substrate region 14, which is a heavily doped region and has a doping concentration that is greater than $10^{18}$ cm$^{-3}$; a voltage-sustaining region, which is located on a surface of the semiconductor first substrate region, and comprises mutually alternating semiconductor first drift regions 10 and semiconductor second drift regions 20 of different conductivity types, the semiconductor first drift region 10 has a conductivity type the same as that of the semiconductor first substrate region 14, which conductivity type being N type, and the semiconductor second drift region 20 has a conductivity type of P type; a semiconductor field stop region 13 having a conductivity type the same as that of the semiconductor first substrate region 14, that is N type, and located on a surface of the semiconductor first substrate region 14, wherein at least one semiconductor collector region 22 having a conductivity type of P type is provided in the semiconductor field stop region 13, and a portion of a surface of the semiconductor collector region 22 is covered with a conductor to form a collector 3 of the transistor; a semiconductor body region 21 having a conductivity type of P type; a semiconductor emitter region 11 having a conductivity type of N type and is located in the semiconductor body region 21, a portion of the semiconductor body region 21 and a portion of the semiconductor emitter region 11 being connected by a conductor to form an emitter 1 of the transistor; a gate insulating layer 40 covering a portion of a surface of the semiconductor emitter region 11, a portion of a surface of the semiconductor body region 21, and a portion of a surface of the voltage-sustaining region, wherein a semiconductor polysilicon gate region 30 covering a surface of the gate insulating layer 40 and a conductor covering the semiconductor polysilicon gate region 30 form a gate electrode 2 of the transistor, the polysilicon gate region 30 has a conductivity type of N type; and a portion of the semiconductor emitter region 11, a portion of the semiconductor body region 21, the gate insulating layer 40, the semiconductor polysilicon gate region 30, the gate electrode 2 and a portion of the voltage-sustaining region form a gate structure of the transistor, and the gate structure is a planar gate structure or a trench gate structure; wherein the semiconductor first drift region 10 and the semiconductor second drift region 20 are in contact with each other and contact surfaces are perpendicular to the semiconductor first substrate region 14 and the semiconductor field stop region 13; the voltage-sustaining region and the semiconductor field stop region 13 are in contact with each other and a contact surface is perpendicular to the semiconductor first substrate region 14; the semiconductor field stop region 13 is in contact with the semiconductor collector region 22 through a semiconductor auxiliary region 24 having a conductivity type of P type, wherein a contact surface is perpendicular to the semiconductor first substrate region 14, the semiconductor collector region 22 is located in the semiconductor auxiliary region 24, and the semiconductor auxiliary region 24 adopts an impurity concentration distribution the same as that of the semiconductor second drift region 20; the cell structure further comprises a second substrate region 23 located on a bottom surface of the semiconductor first substrate region 14 and having a doping concentration lower than that of the semiconductor first substrate region 14.

Figure 10A:
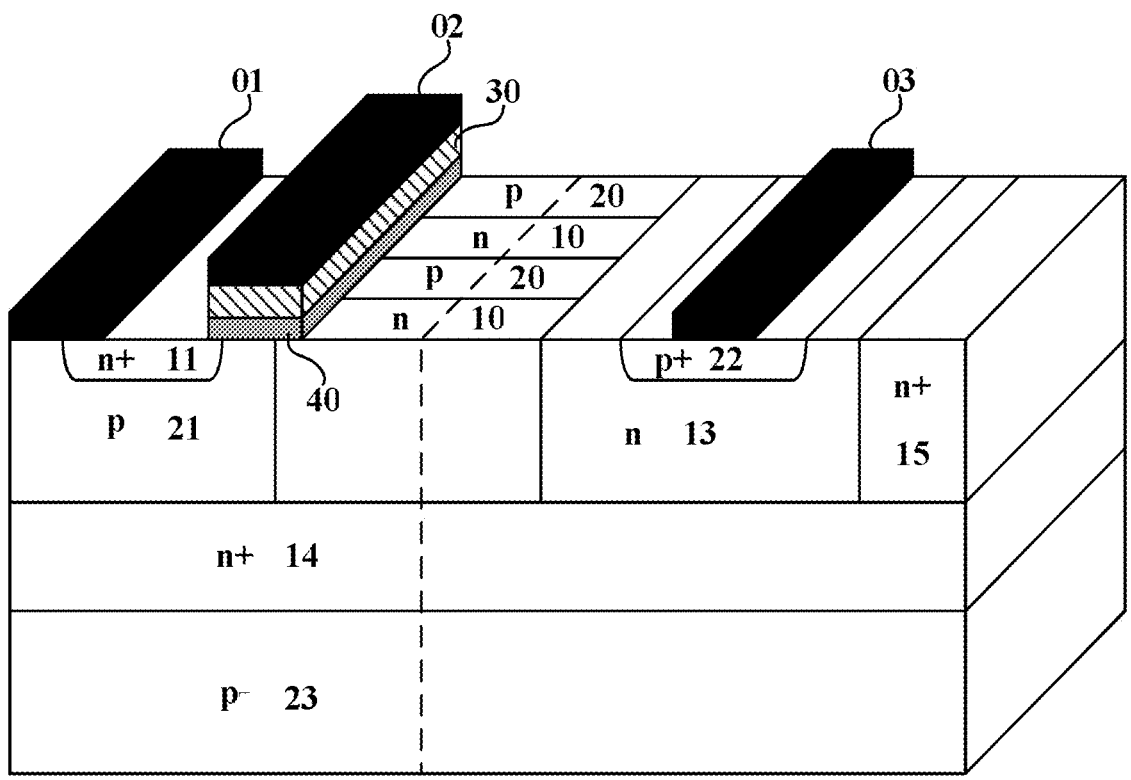
FIG. 10a is a schematic structural view of a superjunction LIGBT corresponding to Example 7 of the present disclosure.
Figure 10B:
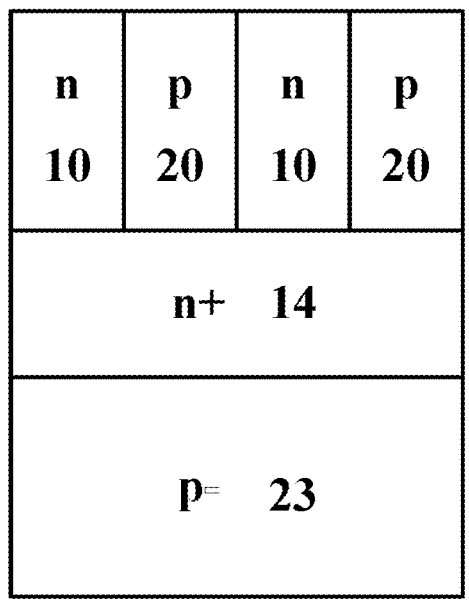

As shown in FIG. 10a to FIG. 10b, the superjunction LIGBT has a cell structure including: a semiconductor first substrate region 14, which is a heavily doped region and has a doping concentration that is greater than $10^{18}$ cm$^{-3}$; a voltage-sustaining region, which is located on a surface of the semiconductor first substrate region, and comprises mutually alternating semiconductor first drift regions 10 and semiconductor second drift regions 20 of different conductivity types, the semiconductor first drift region 10 has a conductivity type the same as that of the semiconductor first substrate region 14, which conductivity type being N type, and the semiconductor second drift region 20 has a conductivity type of P type; a semiconductor field stop region 13 having a conductivity type the same as that of the semiconductor first substrate region 14, that is N type, and located on a surface of the semiconductor first substrate region 14, wherein at least one semiconductor collector region 22 having a conductivity type of P type is provided in the semiconductor field stop region 13, and a portion of a surface of the semiconductor collector region 22 is covered with a conductor to form a collector 3 of the transistor; a semiconductor body region 21 having a conductivity type of P type; a semiconductor emitter region 11 having a conductivity type of N type and is located in the semiconductor body region 21, a portion of the semiconductor body region 21 and a portion of the semiconductor emitter region 11 being connected by a conductor to form an emitter 1 of the transistor; a gate insulating layer 40 covering a portion of a surface of the semiconductor emitter region 11, a portion of a surface of the semiconductor body region 21, and a portion of a surface of the voltage-sustaining region, wherein a semiconductor polysilicon gate region 30 covering a surface of the gate insulating layer 40 and a conductor covering the semiconductor polysilicon gate region 30 form a gate electrode 2 of the transistor, the polysilicon gate region 30 has a conductivity type of N type; and a portion of the semiconductor emitter region 11, a portion of the semiconductor body region 21, the gate insulating layer 40, the semiconductor polysilicon gate region 30, the gate electrode 2 and a portion of the voltage-sustaining region form a gate structure of the transistor, and the gate structure is a planar gate structure or a trench gate structure; wherein the semiconductor first drift region 10 and the semiconductor second drift region 20 are in contact with each other and contact surfaces are perpendicular to the semiconductor first substrate region 14 and the semiconductor field stop region 13; the voltage-sustaining region and the semiconductor field stop region 13 are in contact with each other and a contact surface is perpendicular to the semiconductor first substrate region 14; the semiconductor field stop region 13 is provided with at least one semiconductor first isolation region 15 having a conductivity type of N type, the semiconductor first isolation region 15 and the semiconductor first substrate region 14 are in contact with each other; a contact surface of the semiconductor field stop region 13 and the semiconductor first isolation region 15 is perpendicular to the semiconductor first substrate region 14; the cell structure further comprises a second substrate region 23 located on a bottom surface of the semiconductor first substrate region 14 and having a doping concentration lower than that of the semiconductor first substrate region 14.

Figure 11A:
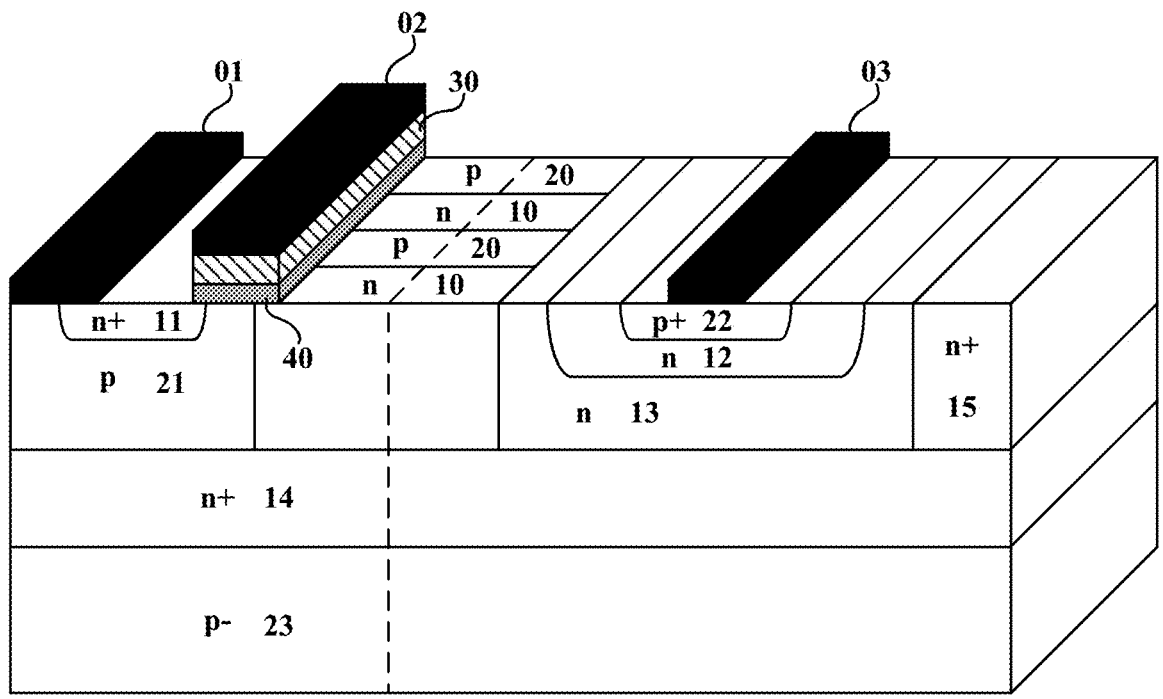
FIG. 11a is a schematic structural view of a superjunction LIGBT corresponding to Example 8 of the present disclosure.
Figure 11B:
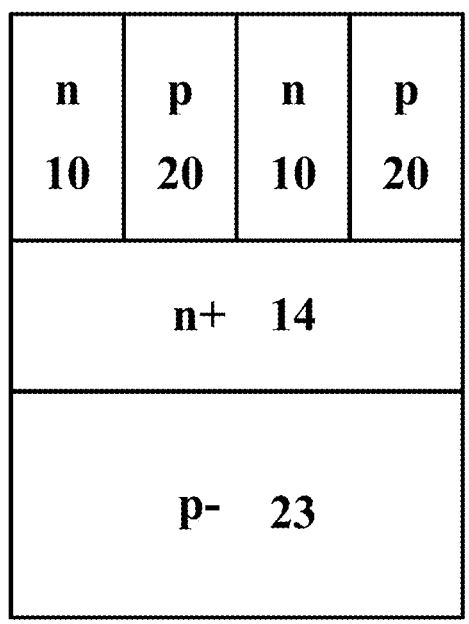

As shown in FIG. 11a to FIG. 11b, the superjunction LIGBT has a cell structure including: a semiconductor first substrate region 14, which is a heavily doped region and has a doping concentration that is greater than $10^{18}$ cm$^{-3}$; a voltage-sustaining region, which is located on a surface of the semiconductor first substrate region, and comprises mutually alternating semiconductor first drift regions 10 and semiconductor second drift regions 20 of different conductivity types, the semiconductor first drift region 10 has a conductivity type the same as that of the semiconductor first substrate region 14, which conductivity type being N type, and the semiconductor second drift region 20 has a conductivity type of P type; a semiconductor field stop region 13 having a conductivity type the same as that of the semiconductor first substrate region 14, that is N type, and located on a surface of the semiconductor first substrate region 14, wherein at least one semiconductor collector region 22 having a conductivity type of P type is provided in the semiconductor field stop region 13, and a portion of a surface of the semiconductor collector region 22 is covered with a conductor to form a collector 3 of the transistor; a semiconductor body region 21 having a conductivity type of P type; a semiconductor emitter region 11 having a conductivity type of N type and is located in the semiconductor body region 21, a portion of the semiconductor body region 21 and a portion of the semiconductor emitter region 11 being connected by a conductor to form an emitter 1 of the transistor; a gate insulating layer 40 covering a portion of a surface of the semiconductor emitter region 11, a portion of a surface of the semiconductor body region 21, and a portion of a surface of the voltage-sustaining region, wherein a semiconductor polysilicon gate region 30 covering a surface of the gate insulating layer 40 and a conductor covering the semiconductor polysilicon gate region 30 form a gate electrode 2 of the transistor, the polysilicon gate region 30 has a conductivity type of N type; and a portion of the semiconductor emitter region 11, a portion of the semiconductor body region 21, the gate insulating layer 40, the semiconductor polysilicon gate region 30, the gate electrode 2 and a portion of the voltage-sustaining region form a gate structure of the transistor, and the gate structure is a planar gate structure or a trench gate structure; wherein the semiconductor first drift region 10 and the semiconductor second drift region 20 are in contact with each other and contact surfaces are perpendicular to the semiconductor first substrate region 14 and the semiconductor field stop region 13; the voltage-sustaining region and the semiconductor field stop region 13 are in contact with each other and a contact surface is perpendicular to the semiconductor first substrate region 14; the semiconductor field stop region 13 is in contact with the semiconductor collector region 22 through a semiconductor buffer region 12 having a conductivity type of N type, wherein the semiconductor buffer region 12 is located in the semiconductor field stop region 13, and the semiconductor collector region 22 is located in the semiconductor buffer region 12; the semiconductor field stop region 13 is provided with at least one semiconductor first isolation region 15 having a conductivity type of N type, the semiconductor first isolation region 15 and the semiconductor first substrate region 14 are in contact with each other; a contact surface of the semiconductor field stop region 13 and the semiconductor first isolation region 15 is perpendicular to the semiconductor first substrate region 14; the cell structure further comprises a second substrate region 23 located on a bottom surface of the semiconductor first substrate region 14 and having a doping concentration lower than that of the semiconductor first substrate region 14.

Figure 12A:
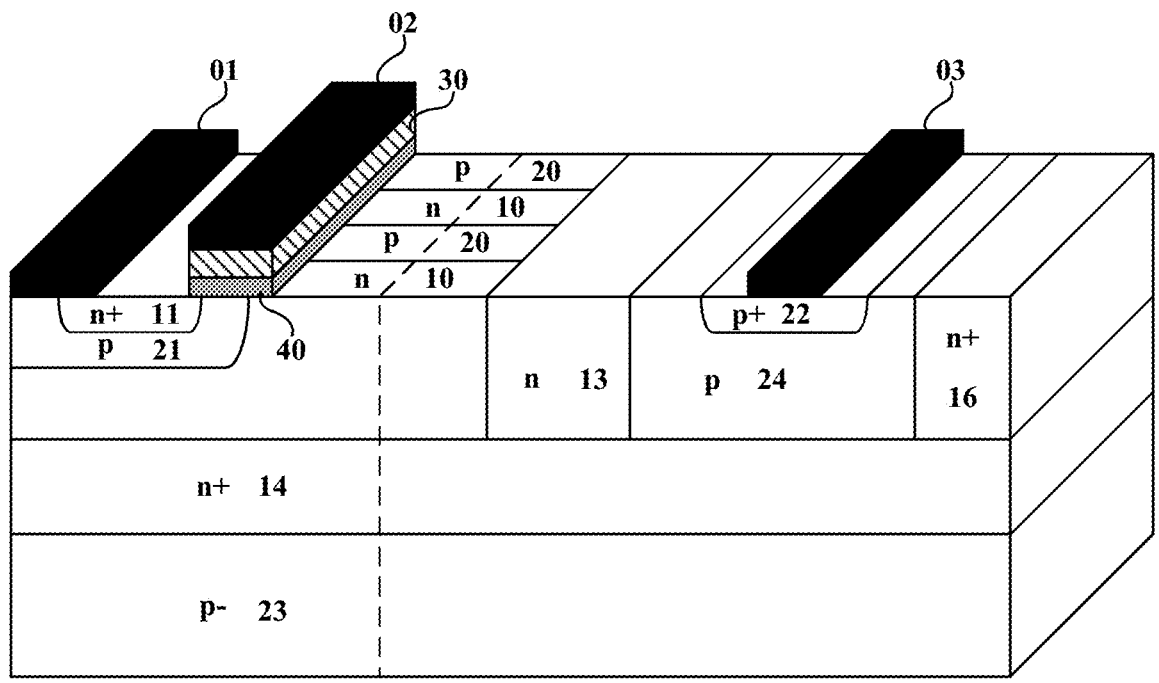
FIG. 12a is a schematic structural view of a superjunction LIGBT corresponding to Example 9 of the present disclosure.
Figure 12B:
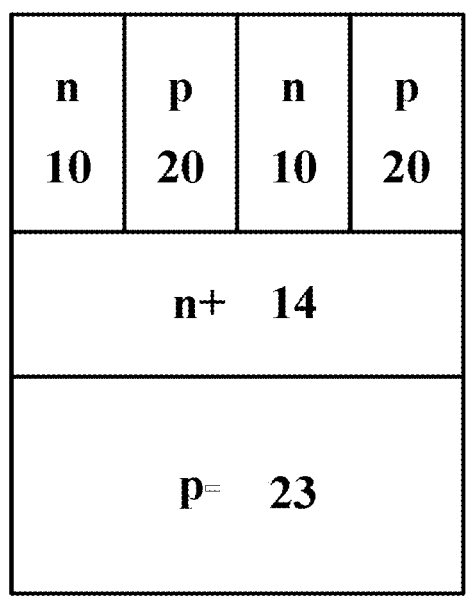

As shown in FIG. 12a to FIG. 12b, the superjunction LIGBT has a cell structure including: a semiconductor first substrate region 14, which is a heavily doped region and has a doping concentration that is greater than $10^{18}$ cm$^{-3}$; a voltage-sustaining region, which is located on a surface of the semiconductor first substrate region, and comprises mutually alternating semiconductor first drift regions 10 and semiconductor second drift regions 20 of different conductivity types, the semiconductor first drift region 10 has a conductivity type the same as that of the semiconductor first substrate region 14, which conductivity type being N type, and the semiconductor second drift region 20 has a conductivity type of P type; a semiconductor field stop region 13 having a conductivity type the same as that of the semiconductor first substrate region 14, that is N type, and located on a surface of the semiconductor first substrate region 14, wherein at least one semiconductor collector region 22 having a conductivity type of P type is provided in the semiconductor field stop region 13, and a portion of a surface of the semiconductor collector region 22 is covered with a conductor to form a collector 3 of the transistor; a semiconductor body region 21 having a conductivity type of P type; a semiconductor emitter region 11 having a conductivity type of N type and is located in the semiconductor body region 21, a portion of the semiconductor body region 21 and a portion of the semiconductor emitter region 11 being connected by a conductor to form an emitter 1 of the transistor; a gate insulating layer 40 covering a portion of a surface of the semiconductor emitter region 11, a portion of a surface of the semiconductor body region 21, and a portion of a surface of the voltage-sustaining region, wherein a semiconductor polysilicon gate region 30 covering a surface of the gate insulating layer 40 and a conductor covering the semiconductor polysilicon gate region 30 form a gate electrode 2 of the transistor, the polysilicon gate region 30 has a conductivity type of N type; and a portion of the semiconductor emitter region 11, a portion of the semiconductor body region 21, the gate insulating layer 40, the semiconductor polysilicon gate region 30, the gate electrode 2 and a portion of the voltage-sustaining region form a gate structure of the transistor, and the gate structure is a planar gate structure or a trench gate structure; wherein the semiconductor first drift region 10 and the semiconductor second drift region 20 are in contact with each other and contact surfaces are perpendicular to the semiconductor first substrate region 14 and the semiconductor field stop region 13; the voltage-sustaining region and the semiconductor field stop region 13 are in contact with each other and a contact surface is perpendicular to the semiconductor first substrate region 14; the semiconductor field stop region 13 is in contact with the semiconductor collector region 22 through a semiconductor auxiliary region 24 having a conductivity type of P type, wherein a contact surface is perpendicular to the semiconductor first substrate region 14, the semiconductor collector region 22 is located in the semiconductor auxiliary region 24, and the semiconductor auxiliary region 24 adopts an impurity concentration distribution the same as that of the semiconductor second drift region 20; the semiconductor auxiliary region 24 is provided with at least one semiconductor second isolation region 16 having a conductivity type of N type, the semiconductor second isolation region 16 and the semiconductor first substrate region 14 are in contact with each other; a contact surface of the semiconductor auxiliary region 24 and the semiconductor second isolation region 16 is perpendicular to the semiconductor first substrate region 14; the cell structure further comprises a second substrate region 23 located on a bottom surface of the semiconductor first substrate region 14 and having a doping concentration lower than that of the semiconductor first substrate region 14.

In addition, since in case that the first conductivity type is P type and the second conductivity type is N type, the structure and principle of the superjunction LIGBT is similar to the case that the first conductivity type is N type, this will not be described herein.

The above is only a preferred embodiment of the present disclosure, and the scope of the present disclosure is not limited thereto. Any equivalent substitutions and modifications made by one skilled in the art according to the technical solution and its inventive concept of the present disclosure within the technical scope disclosed by the present disclosure are intended to be included within the scope of the present disclosure.

What is claimed is:

1. A high-speed superjunction lateral insulated gate bipolar transistor, characterized in that a cell structure of the transistor comprises:

a semiconductor first substrate region;

a voltage-sustaining region, which is located on a surface of the semiconductor first substrate region, and comprises mutually alternating semiconductor first drift regions and semiconductor second drift regions of different conductivity types, the semiconductor first drift region has a conductivity type the same as that of the semiconductor first substrate region, and the semiconductor second drift region has a conductivity type opposite to that of the semiconductor first substrate region, the conductivity type being N type or P type;

a semiconductor field stop region having a conductivity type the same as that of the semiconductor first substrate region and located on a surface of the semiconductor first substrate region, wherein at least one semiconductor collector region having a conductivity type opposite to that of the semiconductor first substrate region is provided in the semiconductor field stop region, and a portion of a surface of the semiconductor collector region is covered with a conductor to form a collector of the transistor;

a semiconductor body region having a conductivity type opposite to that of the semiconductor first substrate region;

a semiconductor emitter region having a conductivity type the same as that of the semiconductor first substrate region and located in the semiconductor body region, a portion of the semiconductor body region and a portion of the semiconductor emitter region being connected by a conductor to form an emitter of the transistor;

a gate insulating layer covering a portion of a surface of the semiconductor emitter region, a portion of a surface of the semiconductor body region, and a portion of a surface of the voltage-sustaining region, wherein a semiconductor polysilicon gate region covering a surface of the gate insulating layer and a conductor covering the semiconductor polysilicon gate region form a gate electrode of the transistor, the gate region has a conductivity type the same as that of the semiconductor first substrate region; and a portion of the semiconductor emitter region, a portion of the semiconductor body region, the gate insulating layer, the semiconductor polysilicon gate region, the gate electrode and a portion of the voltage-sustaining region form a gate structure of the transistor;

wherein the semiconductor first drift region and the semiconductor second drift region are in contact with each other and contact surfaces are perpendicular to the semiconductor first substrate region and the semiconductor field stop region;

the voltage-sustaining region and the semiconductor field stop region are in contact with each other and a contact surface is perpendicular to the semiconductor first substrate region.

2. The high-speed superjunction lateral insulated gate bipolar transistor of claim 1 wherein:

the semiconductor field stop region is in contact with the semiconductor collector region through a semiconductor buffer region having a conductivity type the same as that of the semiconductor first substrate region, wherein the semiconductor buffer region is located in the semiconductor field stop region, and the semiconductor collector region is located in the semiconductor buffer region.

3. The high-speed superjunction lateral insulated gate bipolar transistor of claim 1 wherein:

the semiconductor field stop region is in contact with the semiconductor collector region through a semiconductor auxiliary region having a conductivity type opposite to that of the semiconductor first substrate region, wherein a contact surface is perpendicular to the semiconductor first substrate region, the semiconductor collector region is located in the semiconductor auxiliary region, and the semiconductor auxiliary region adopts an impurity concentration distribution the same as that of the semiconductor second drift region.

4. The high-speed superjunction lateral insulated gate bipolar transistor of claim 1 wherein:

the cell structure further comprises a second substrate region located on a bottom surface of the semiconductor first substrate region and having a doping concentration lower than that of the semiconductor first substrate region.

5. The high-speed superjunction lateral insulated gate bipolar transistor of claim 4 wherein:

the semiconductor field stop region is further in contact with the semiconductor collector region by a semiconductor buffer region having a conductivity type the same as the semiconductor first substrate region, wherein the semiconductor buffer region is located in the semiconductor field stop region, and the semiconductor collector region is located in the semiconductor buffer region.

6. The high-speed superjunction lateral insulated gate bipolar transistor of claim 4 wherein:

the semiconductor field stop region is further in contact with the semiconductor collector region through a semiconductor auxiliary region having a conductivity type opposite to that of the semiconductor first substrate region, wherein a contact surface is perpendicular to the semiconductor first substrate region, the semiconductor collector region is located in the semiconductor auxiliary region, and the semiconductor auxiliary region adopts an impurity concentration distribution the same as that of the semiconductor second drift region.

7. The high-speed superjunction lateral insulated gate bipolar transistor of claim 4 wherein:

the semiconductor field stop region is provided with at least one semiconductor first isolation region having a conductivity type the same as that of the semiconductor first substrate region, the semiconductor first isolation region and the semiconductor first substrate region are in contact with each other; a contact surface of the semiconductor field stop region and the semiconductor first isolation region is perpendicular to the semiconductor first substrate region.

8. The high-speed superjunction lateral insulated gate bipolar transistor of claim 7 wherein:

the semiconductor field stop region is further in contact with the semiconductor collector region through a semiconductor buffer region having a conductivity type the same as that of the semiconductor first substrate region, wherein the semiconductor buffer region is located in the semiconductor field stop region, and the semiconductor collector region is located in the semiconductor buffer region.

9. The high-speed superjunction lateral insulated gate bipolar transistor of claim 6 wherein:

the semiconductor auxiliary region is provided with at least one semiconductor second isolation region having a conductivity type the same as that of the semiconductor first substrate region, the semiconductor second isolation region and the semiconductor first substrate region are in contact with each other; a contact surface of the semiconductor auxiliary region and the semiconductor second isolation region is perpendicular to the semiconductor first substrate region.

10. The high-speed superjunction lateral insulated gate bipolar transistor of claim 1 wherein:

the semiconductor first substrate region is a heavily doped region having a doping concentration greater than $10^{18}$ $cm^{-3}$.

* * * * *